United States Patent
Aslami et al.

(10) Patent No.: US 11,606,074 B2
(45) Date of Patent: Mar. 14, 2023

(54) COMMUNICATION ON TWO POWER SUPPLY CHANNELS

(71) Applicant: Baker Hughes Oilfield Operations LLC, Houston, TX (US)

(72) Inventors: Farid Aslami, Houston, TX (US); Reinhard Friedemann, Houston, TX (US)

(73) Assignee: Baker Hughes Oilfield Operations LLC, Houston, TX (US)

(*) Notice: Subject to any disclaimer, the term of this patent is extended or adjusted under 35 U.S.C. 154(b) by 365 days.

(21) Appl. No.: 16/881,416

(22) Filed: May 22, 2020

(65) Prior Publication Data
US 2021/0367796 A1    Nov. 25, 2021

(51) Int. Cl.
| | |
|---|---|
| H03H 7/01 | (2006.01) |
| H03H 1/00 | (2006.01) |
| H03H 7/42 | (2006.01) |
| H01F 17/00 | (2006.01) |
| H04L 12/10 | (2006.01) |
| H05G 1/10 | (2006.01) |

(52) U.S. Cl.
CPC ........... *H03H 7/0115* (2013.01); *H01F 17/00* (2013.01); *H03H 1/0007* (2013.01); *H03H 7/427* (2013.01); *H04L 12/10* (2013.01); *H05G 1/10* (2013.01); *H01F 2017/0093* (2013.01)

(58) Field of Classification Search
CPC .... H03H 7/427; H03H 1/0007; H03H 7/0115; H01F 2017/0093
USPC ......................................... 333/175, 181, 185
See application file for complete search history.

(56) References Cited

U.S. PATENT DOCUMENTS

| 8,767,867 B1 * | 7/2014 | Castor-Perry ............ H03C 3/00 375/295 |
| 9,350,315 B1 * | 5/2016 | Gonzalez Moreno .. H01F 27/28 |

\* cited by examiner

*Primary Examiner* — Rakesh B Patel
(74) *Attorney, Agent, or Firm* — Mintz Levin Cohn Ferris Glovsky and Popeo, PC

(57) ABSTRACT

A Communication System includes a first power supply channel including a first impedance and a second impedance, and configured to transfer electrical power from a first power source to a first load. The first power supply channel is configured to electrically couple to the first power source via a first common mode choke. The communication system also includes a second power supply channel comprising a third impedance and a fourth impedance, and configured to transfer electrical power from a second power source to a second load. The second power supply channel is configured to electrically couple to the second power source via a second common mode choke. The communication system further includes a first transceiver comprising a first output pin electrically coupled to the first power supply channel and a second output pin electrically coupled to the second power supply channel at a first end of the communication system.

20 Claims, 2 Drawing Sheets

COMMUNICATION ON TWO POWER SUPPLY CHANNELS

BACKGROUND

Power over Ethernet (PoE) allows for transmission for electrical power over network cables. This can allow a data connection (e.g., Ethernet cables) to carry electric power from a power sourcing equipment (e.g., network switches, PoE injectors intended for use with non-PoE switches, etc.) to a powered device (e.g., IP cameras, routers, VoIP phones, etc.). PoE allows for installation of remote or outside equipment without having to connect to AC power. Moreover, such installation can be achieved without the need for an electrician.

SUMMARY

Various aspects of the disclosed subject matter may provide one or more of the following capabilities. Communicating data over power supply lines can reduce the cost and complexity of adding a dedicated data cable (e.g., Ethernet cable). For example, adding a dedicated data cable for power supply lines that extend over greater than 100 meters can be expensive. Additionally, long Ethernet cables can be heavy and undesirable.

In one implementation, a communication system includes a first power supply channel including a first impedance and a second impedance. The first power supply channel is configured to transfer electrical power from a first power source to a first load. The first power supply channel is configured to electrically couple to the first power source via a first common mode choke. The communication system also includes a second power supply channel comprising a third impedance and a fourth impedance. The second power supply channel is configured to transfer electrical power from a second power source to a second load. The second power supply channel is configured to electrically couple to the second power source via a second common mode choke. The communication system further includes a first transceiver comprising a first output pin electrically coupled to the first power supply channel and a second output pin electrically coupled to the second power supply channel at a first end of the communication system. The first transceiver is configured to generate a differential signal comprising a first signal and a second signal. The first signal is transmitted to the first power supply channel via the first output pin, and the second signal is transmitted to the second power supply channel via the second output pin.

One or more of the following features can be included in any feasible combination.

In one implementation, the first output pin is electrically coupled to the first impedance via a first capacitor and to the second impedance via a second capacitor. The second output pin is electrically coupled to the third impedance via a third capacitor and to the fourth impedance via a fourth capacitor. In another implementation, the first impedance and the first capacitor are coupled to a first choke pin of the first common mode choke; and the second impedance and the second capacitor are coupled to a second choke pin of the first common mode choke. In yet another implementation, the first choke pin of the first common mode choke is configured to receive a first portion of the first signal via the first capacitor, and the second choke pin of the first common mode is configured to receive a second portion of the first signal via the second capacitor; and the first common mode choke is configured to prevent transmission of the first signal to the first power source.

In one implementation, the third impedance and the third capacitor are coupled to a third choke pin of the second common mode choke; and the fourth impedance and the fourth capacitor are coupled to a fourth choke pin of the second common mode choke. In another implementation, the first load is coupled to the first power supply channel via a third common mode choke. In yet another implementation, the second load is coupled to the second power supply channel via a fourth common mode choke.

In one implementation, the communication system further includes a second transceiver comprising a first input pin electrically coupled to the first power supply channel and a second input pin electrically coupled to the second power supply channel at a second end of the communication system. The second transceiver is configured to receive at least a portion of the first signal transmitted over the first power supply channel and at least a portion of the second signal transmitted over the second power supply channel. In another implementation, the first input pin is electrically coupled to the first impedance and the second impedance via a fifth capacitor and a sixth capacitor, respectively. The second input pin is electrically coupled to the third impedance and the fourth impedance via a seventh capacitor and an eight capacitor, respectively.

In one implementation, the first impedance and the fifth capacitor are coupled to a fifth choke pin of the third common mode choke, and the second impedance and the sixth capacitor are coupled to a sixth choke pin of the third common mode choke. In another implementation, the third impedance and the seventh capacitor are coupled to a seventh choke pin of the fourth common mode choke, and the fourth impedance and the eighth capacitor are coupled to an eight choke pin of the fourth common mode choke. In yet another implementation, the first transceiver is configured to generate the first differential signal based on an input signal generated by a first device electrically coupled to a third input pin of the first transceiver.

In one implementation, the second transceiver is configured to generate an output signal representative of the input signal based on the at least the portion of the first signal transmitted over the first power supply channel and the at least the portion of the second signal transmitted over the second power supply channel. In another implementation, the input signal and the output signal include a control signal configured to control the operation of a second device electrically coupled to a third output pin of the second transceiver. In yet another implementation, the first load includes an X-ray source and the second load includes a microcontroller configured to control the operation of the X-ray source.

In one implementation, the first device is a computing device and the second device is a USB camera configured to view the operation of the X-ray source. In another implementation, the first common mode choke includes a first pair of load pins configured to electrically couple to the first power source. In one implementation, the second common mode choke includes a second pair of load pins configured to electrically couple to the second power source. In another implementation, the first communication channel is a transmission line. In one implementation, the input signal is proportional to a difference between the first signal and the second signal.

These and other capabilities of the disclosed subject matter will be more fully understood after a review of the following figures, detailed description, and claims.

BRIEF DESCRIPTION OF THE FIGURES

These and other features will be more readily understood from the following detailed description taken in conjunction with the accompanying drawings, in which.

DETAILED DESCRIPTION

Data cables (e.g., Ethernet cables) can transmit small electrical power (e.g., less than 50 watts) over small distances (e.g., less than 100 meters) to power devices that have low energy requirements (e.g., routers, cameras, etc.). This can prevent installing separate connections for transmitting power and data, which can lower cost and improve efficiency. However, a device or a system of multiple devices that consume power greater than the transmission power-limit of data cables may require dedicated power cables in addition to the data cables. In order to transmit both data and electrical power to a system of devices with large energy requirements, data can be transmitted over power cables with high power-transmission thresholds. This can be achieved, for example, by transmitting a first portion of a data signal over a first power supply channel and a second portion of the data signal over a second power supply channel. On the other end of the first and second power supply channel, the first and the second portion of the data signal can be combined to generate a signal indicative of the input data signal.

Since both the electrical power signal and the data signal are transmitted over a common power supply channel, it can be desirable to prevent the transmission of data to devices associated with power transmission (e.g., power source, power load, etc.) and/or prevent transmission of electrical power to devices associated with data transmission (e.g., transceivers). In one implementation, a common mode choke between the power source/power load and the power supply channel. The common mode choke can attenuate (or prevent) the transmission of the data signal to the source of the electrical power and/or the load receiving the electrical. In one implementation, one or more capacitors can be placed between the power supply channel and the transceivers. The capacitors can attenuate (or prevent) the transmission of electrical power (e.g., DC power signal) to the transceivers.

Figure 1:
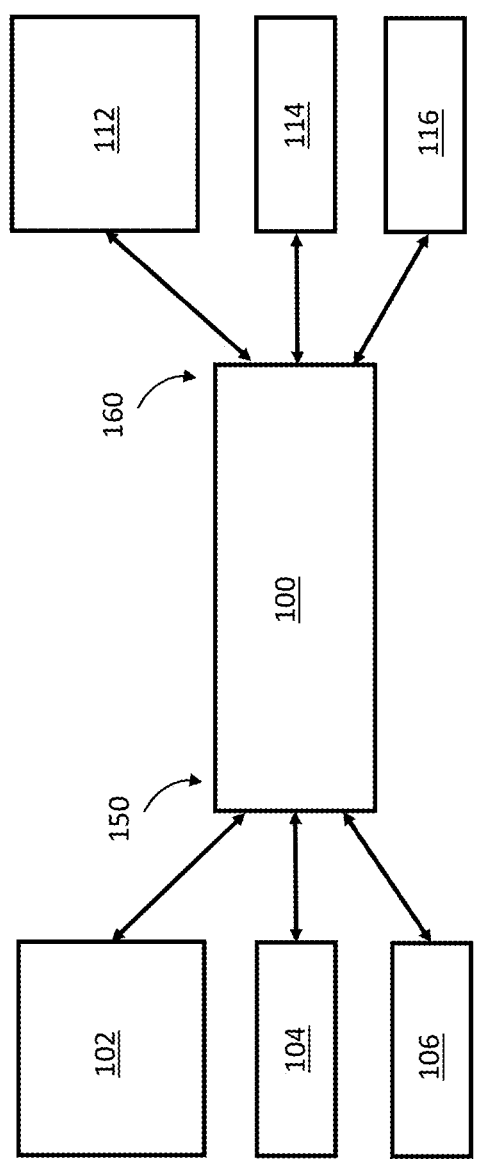
FIG. 1 illustrates a schematic of a communication system that can transmit both data signal and electrical power.

FIG. 1 illustrates a schematic of a communication system 100 that can transmit both data signal and electrical power from a first end 150 to a second end 160. At the first end 150, the communication system 100 can be coupled to a first device 102 (e.g., a computation device, a USB camera, etc.), a first power source 104 and a second power source 106. The first power source 104 and the second power source 106 can transmit electrical power over a first and a second power supply channel (not shown), respectively, of the communication system 100. At the second end 160, the communication system 100 can be coupled to a second device 112 (e.g., a USB camera, a communication device, etc.), a first load 114 and a second load 116. The communication system 100 can include a first power supply channel that can receive electrical power from the first power source 104, and a second power supply channel that can receive electrical power from the second power source 106. The first load 114 can receive power from the first power source 104 via the first power supply channel, and the second load 116 can receive power from the second power source 106 via the second power supply channel.

The communication system 100 can include a first transceiver (not shown) at the first end 150 that can receive an input signal (e.g., a control signal, a data signal, etc.) from the first device 102 and generate a differential signal. The differential signal can include a first signal and a second signal that can be transmitted over the first power supply channel and the second power supply channel, respectively. The communication system 100 can include a second transceiver (not shown) at the second end 160 that can receive the first signal and the second signal and generate an output signal that can be received by the second device 112. Additionally or alternately, the communication system 100 can transmit a signal from the second device 112 to the first device 102 via the first and second power supply channel based on the principle described above. The output signal can be representative of the input signal received by the communication system 100.

Figure 2:
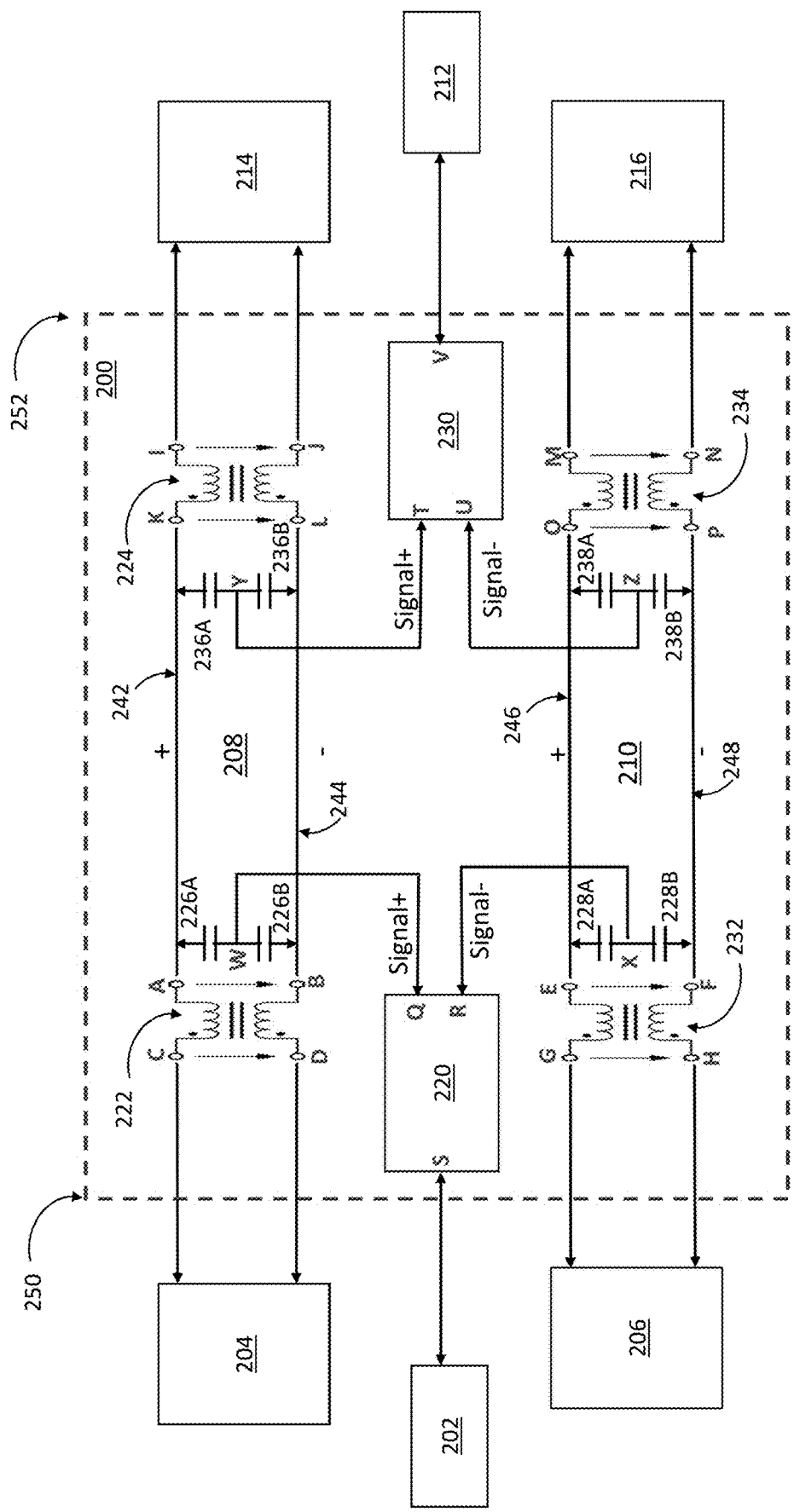
FIG. 2 illustrates an exemplary design of the communication channel described in FIG. 1.

FIG. 2 illustrates an exemplary communication channel 200 that can transmit electrical power form a first power source 204 (or second power source 206) and a data signal from a first device 202 to a second device 212. The communication channel 200 can include a first power supply channel 208, a second power supply channel 210, a first transceiver 220 and a second transceiver 230. The first power supply channel 208 can transmit electrical power from the first power source 204 to the first load 214. The second power supply channel 210 can transmit electrical power from the second power source 206 to the second load 216. The first power source 204, the second power source 206 and the first transceiver 220 can be located at a first end 250 of the communication channel 200. The first load 214, the second load 216 and the second transceiver 230 can be located at a second end 252 of the communication channel 200.

A power supply channel can include a plurality of impedances including conductive metals (e.g., that can be resistive, inductive, capacitive, etc.). In one implementation, the power supply channel can be a two-impedance transmission line (e.g., coaxial cable, stripline, microstrip, etc.) that can include, for example, two-impedance arranged parallel to each other. The first power supply channel 208 and the second power supply channel 210 can include a two-impedance transmission line. A transceiver (e.g., first transceiver 220) can receive an input signal and generate a differential signal indicative of the input signal. The differential signal can include a pair of complementary signals that can separately travel along different impedances (e.g., different power supply channels). A second transceiver (e.g., second transceiver 230) can receive the differential signal and generate an output signal indicative of the input signal. This can be done, for example, by determining a difference between the pair of complementary signals. One of the advantages of differential signaling is that an external interference (e.g., electromagnetic interference) may equally effect the complementary signal, and by calculating a difference between the complimentary signals, the effect of the external interference can be reduced (or removed).

The first power supply channel 208 can include a first impedance 242 and a second impedance 244 that are electrically coupled to the first power source 204 via a first common mode choke 222 ("first choke") at the first end 250. In one implementation, a common mode choke (CMC) can have several different windings where a working current can flow in opposite directions (e.g., clockwise vs counter clockwise). For example, current in a first winding (e.g., corresponding to a choke pin A of the first choke 222) can flow in the opposite direction relative to current in a second winding (e.g., corresponding to choke pin B of the first choke 222). As a result, the magnetic field generated by the two windings can cancel each other out (e.g., in the core of the CMC). This can result in a compact and economical construction of the CMC. The CMC can form a high inductance for common-mode interferences (e.g., when the same signal is received at the input pins of the CMC [e.g., at pins A and B of first choke 222]) and prevent transmission of data signal from the first power supply channel 208 to the power source 204. However, the CMC can allow a DC signal to pass through. As a result, the first choke 222 can transmit a DC power signal from the power source 204 to the first load 214 but suppress (or prevent) transmission of Signal+ (from a transceiver 220 to the power source 204). The above-mentioned analysis can also be applied to second choke 224, third choke 232 and fourth choke 234. For example, one or more of the aforementioned chokes can (a) suppress (or prevent) transmission of data signal (e.g., Signal+, Signal−, etc.) from the power supply channel (e.g., first power supply channel 208, second power supply channel 210, etc.) to devices associated with power transmission (e.g., first power source 204, second power source 206, first load 214, second load 216, etc.); (b) allow for transmission of DC power supply from the devices associated with power transmission (e.g., first power source 204, second power source 206, first load 214, second load 216, etc.) to the power supply channel (e.g., first power supply channel 208, second power supply channel 210, etc.).

The first impedance 242 is connected to a choke pin A of the first choke 222, and the second impedance 244 is connected to a second choke pin B of the first choke 222. The first choke 222 is connected to the first power source 204 via choke pins C and D. The first impedance 242 and the second impedance 244 are electrically coupled to the first load 214 via a second common mode choke 224 ("second choke") at the second end 252. The first impedance 242 is connected to a choke pin K of the second choke 224, and the second impedance 244 is connected to a choke pin L of the second choke 224. The second choke 224 is connected to the first load 214 via choke pins I and J.

The second power supply channel 210 can include a third impedance 246 and a fourth impedance 248 that are electrically coupled to the second power source 206 via a third common mode choke 232 ("third choke") at the first end 250. The third impedance 246 is connected to a choke pin E of the third choke 232, and the fourth impedance 248 is connected to a choke pin F of the third choke 232. The third choke 232 is connected to the second power source 206 via choke pins G and H. The third impedance 246 and the fourth impedance 248 are electrically coupled to the second load 216 via a fourth common mode choke 234 ("fourth choke") at the second end 252. The third impedance 246 is connected to a choke pin O of the fourth choke 234, and the fourth impedance 248 is connected to a choke pin P of the fourth choke 234. The fourth choke 234 is connected to the second load 216 via choke pins M and N.

The first transceiver 220 can receive an input signal from a first device 202 (e.g., a control signal from a computing device, a data signal from a camera, etc.) at an input pin S and generate a differential signal indicative of the input signal. The differential signal can include a first signal transmitted to the first power supply channel 208 via a first output pin Q of the first transceiver 220, and a second signal transmitted to the second power supply channel 210 via a second output pin R of the first transceiver 220. The first power supply channel 208 and the second power supply channel 210 can transmit the first and the second signals, respectively, from the first end 250 to the second end 252. The first power supply channel 208 can also transmit a power signal (e.g., a DC voltage signal) carrying electrical power from the first source 204 to the first load 214. The second power supply channel 210 can also transmit a power signal (e.g., a DC voltage signal) carrying electrical power from the second source 206 to the second load 216.

It can be desirable to insulate the first power source 204 from a voltage or a current signal (e.g., the first signal [Signal+] of the differential signal) in the first power supply channel 208. The first power supply channel 208 can reduce (or prevent) transfer of the first signal (or a portion thereof) to the first power source 204. This can be achieved, for example, by splitting the first signal into a first sub-signal and a second sub-signal that are transmitted to the choke pin A and the choke pin B, respectively, of the first choke 222. The first signal can be received by node W in the first power supply channel 208, which is electrically coupled to the first impedance 242 (and choke pin A) and the second impedance 244 (and choke pin B) via capacitor 226A and capacitor 226B, respectively. The capacitors 226A and 226B can operate as high pass filters and attenuate (or block) DC component of the first signal from being transmitted to the first impedance 242 (and choke pin A) and the second impedance 244 (and choke pin B). Alternately, the capacitors 226A and 226B can attenuate (or block) a DC component of a signal transmitted from the first supply channel 208 to the output pin Q. In one implementation, if the capacitors 226A and 226B have similar (or same) capacitance, the first sub-signal and the second sub-signal can be similar (e.g., same). As described above, if the first sub-signal received at pin A of the first choke 222 and the second sub-signal received at pin B of the first choke 222 are similar (e.g., same), the first signal (Signal+) will not be transmitted to the first power source 204.

The capacitor 226A and the capacitor 226B are connected to the first choke 222 at choke pin A and choke pin B, respectively. In one implementation, the capacitor 226A and the capacitor 226B can have similar (or same) capacitance. As a result, the first sub-signal and the second sub-signal can be similar (or same). The first choke 222 can attenuate (or block) the transmission of the first and second sub-signals to the first power source 204. For example, the first choke 222 can be configured such that a difference between the signals received at choke pins A and B is transmitted to choke pins C and D. The first and second sub-signals (or a portion thereof) can be transmitted over the first impedance 242 and second impedance 244, respectively, and can be received at node Y. The signal at node Y can be transmitted to the input pin T of the second transceiver 230. Node Y is connected to the first impedance 242 (and choke pin K) and second impedance 244 (and choke pin L) via capacitor 236A and capacitor 236B, respectively. The capacitors 236A and 236B can operate as high pass filters and attenuate (or block) DC component of the first signal from being transmitted to the input pin T. Alternately, the capacitors 236A and 236B can attenuate (or block) a DC component of a signal transmitted from the input pin T to the first supply channel 208.

It can be desirable to insulate the second power source 206 from a voltage or a current signal (e.g., the second signal ["Signal−"] of the differential signal) in the second power supply channel 210. The second power supply channel 210 can reduce (or prevent) transfer of the second signal (or a portion thereof) to the second power source 206. This can be achieved, for example, by splitting the second signal into a third sub-signal and a fourth sub-signal that are transmitted to the choke pin E and choke pin F, respectively, of the third choke 232. The second signal can be received by node X in the second power supply channel 210. Node X is electrically coupled to the third impedance 246 (and choke pin E) and the fourth impedance 248 (and choke pin F) via capacitor 228A and capacitor 228B, respectively. The capacitors 228A and 228B can operate as high pass filters and attenuate (or block) DC component of the second signal from being transmitted to the third impedance 246 and the fourth impedance 248. Alternately, the capacitors 228A and 228B can attenuate (or block) a DC component of a signal transmitted from the second supply channel 210 to the output pin R. In one implementation, if the capacitors 228A and 228B have similar (or same) capacitance, the third sub-signal and the fourth sub-signal can be similar (e.g., same). As described above, if the third sub-signal received at pin E of the third choke 232 and the fourth sub-signal received at pin F of the third choke 232 are similar (e.g., same), the second signal (Signal-) will not be transmitted to the second power source 206.

The capacitor 228A and the capacitor 228B are connected to the third choke 232 at choke pin E and choke pin F, respectively. In one implementation, the capacitor 228A and the capacitor 228B can have similar (or same) capacitance. As a result, the third sub-signal and the fourth sub-signal can be similar (or same). The third choke 232 can attenuate (or block) the transmission of the third and fourth sub-signals to the second power source 206. For example, the third choke 232 can be configured such that a difference between the signals received at choke pins E and F is transmitted to choke pins G and H. The third and fourth sub-signals can be transmitted over the third impedance 246 and fourth impedance 248, respectively, and can be received at node Z, and transmitted to the input pin U of the second transceiver 230. Node Z is connected to the third impedance 246 (and choke pin O) and fourth impedance 248 (and choke pin P) via a capacitor 238A and a capacitor 238B, respectively. The capacitors 238A and 238B can operate as high pass filters and attenuate (or block) DC component of the third and fourth sub-signal from being transmitted to the input pin U. Alternately, the capacitors 238A and 238B can attenuate (or block) a DC component of a signal transmitted from the input pin U to the second supply channel 210.

The second transceiver 230 can generate an output signal based on the signals received via input pins T and U. For example, based on the first signal (or a portion thereof) received at the input pin T from node Y of the first supply channel 208 and the second signal (or a portion thereof) received at the input pin T from node Z of the second supply channel 210, the second transceiver 230 can generate an output signal. The output signal can be representative of the input signal received from the first device 202 at the input pin S of the first transceiver 220. The output signal (or a portion thereof) can be transmitted to the output device 212 via an output pin V.

In some implementations, the aforementioned communication system 200 can transfer data at a rate ranging between 10 megabit and 100 megabit (e.g., over a distance greater than 100 meters). In some implementations, the first power supply channel 208 can transmit 1500 watts of electrical power at 400 Volt DC voltage to the first load 214. Additionally or alternatively, the second power supply channel 210 can transmit 150 watts of electrical power at 48 Volt DC voltage to the second load 216. In some implementations, the first load 214 can include an X-ray source and the second load 216 can include a microcontroller configured to control the operation of the X-ray source. In some implementations, the first device 202 can be a computing device and the second device 212 can be a USB camera configured to view the operation of the X-ray source. In these implementations, the computing device can transmit a control signal to the USB camera, and the USB camera can transmit a data signal (e.g., indicative of image captured by the USB camera) to the computing device via the communication channel 200.

Other embodiments are within the scope and spirit of the disclosed subject matter. For example, the communication system 200 can be deployed in a system where two or more devices (with same or different voltage/wattage requirements) are powered by two or more power supply channels. Furthermore, the communication system 200 can also transmit data over the two or more power supply lines. Usage of the word "optimize"/"optimizing" in this application can imply "improve"/"improving."

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a Read-Only Memory or a Random Access Memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web interface through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A communication system comprising:
    a first power supply channel comprising a first impedance and a second impedance, the first power supply channel being configured to transfer electrical power from a first power source to a first load, wherein the first power supply channel is configured to electrically couple to the first power source via a first common mode choke;
    a second power supply channel comprising a third impedance and a fourth impedance, the second power supply channel being configured to transfer electrical power from a second power source to a second load, wherein the second power supply channel is configured to electrically couple to the second power source via a second common mode choke; and
    a first transceiver comprising a first output pin electrically coupled to the first power supply channel and a second output pin electrically coupled to the second power supply channel at a first end of the communication system, the first transceiver being configured to generate a differential signal comprising a first signal and a second signal, wherein the first signal is transmitted to the first power supply channel via the first output pin, and the second signal is transmitted to the second power supply channel via the second output pin, and wherein the first output pin is electrically coupled to the first impedance via a first capacitor and to the second impedance via a second capacitor, and wherein the second output pin is electrically coupled to the third impedance via a third capacitor and to the fourth impedance via a fourth capacitor.

2. The communication system of claim 1, wherein the first capacitor attenuates a component of an electrical signal transmitted to the first transceiver.

3. The communication system of claim 1, wherein the first impedance and the first capacitor are coupled to a first choke pin of the first common mode choke, and wherein the second impedance and the second capacitor are coupled to a second choke pin of the first common mode choke.

4. The communication system of claim 3, wherein the first choke pin of the first common mode choke is configured to receive a first portion of the first signal via the first capacitor, and the second choke pin of the first common mode is configured to receive a second portion of the first signal via the second capacitor; and wherein the first common mode choke is configured to prevent transmission of the first signal to the first power source.

5. The communication system of claim 1, wherein the third impedance and the third capacitor are coupled to a third choke pin of the second common mode choke, and wherein the fourth impedance and the fourth capacitor are coupled to a fourth choke pin of the second common mode choke.

6. The communication system of claim 1, wherein the first load is coupled to the first power supply channel via a third common mode choke.

7. The communication system of claim 6, wherein the second load is coupled to the second power supply channel via a fourth common mode choke.

8. The communication system of claim 7, further comprising a second transceiver comprising a first input pin electrically coupled to the first power supply channel and a second input pin electrically coupled to the second power supply channel at a second end of the communication system, the second transceiver configured to receive at least a portion of the first signal transmitted over the first power supply channel and at least a portion of the second signal transmitted over the second power supply channel.

9. The communication system of claim 8, wherein the first input pin is electrically coupled to the first impedance and the second impedance via a fifth capacitor and a sixth capacitor, respectively, and wherein the second input pin is electrically coupled to the third impedance and the fourth impedance via a seventh capacitor and an eight capacitor, respectively.

10. The communication system of claim 9, wherein the first impedance and the fifth capacitor are coupled to a fifth choke pin of the third common mode choke, and wherein the second impedance and the sixth capacitor are coupled to a sixth choke pin of the third common mode choke.

11. The communication system of claim 9, wherein the third impedance and the seventh capacitor are coupled to a seventh choke pin of the fourth common mode choke, and wherein the fourth impedance and an eighth capacitor are coupled to an eight choke pin of the fourth common mode choke.

12. The communication system of claim 8, wherein the first transceiver is configured to generate the differential signal based on an input signal generated by a first device electrically coupled to a third input pin of the first transceiver.

13. The communication system of claim 12, wherein the second transceiver is configured to generate an output signal representative of the input signal based on the at least the portion of the first signal transmitted over the first power supply channel and the at least the portion of the second signal transmitted over the second power supply channel.

14. The communication system of claim 13, wherein the input signal and the output signal comprise a control signal configured to control an operation of a second device electrically coupled to a third output pin of the second transceiver.

15. The communication system of claim 14, wherein the first load comprises an X-ray source and the second load comprises a microcontroller configured to control the operation of the X-ray source.

16. The communication system of claim 15, wherein the first device is a computing device and the second device is a USB camera configured to view the operation of the X-ray source.

17. The communication system of claim 12, wherein the input signal is proportional to a difference between the first signal and the second signal.

18. The communication system of claim 1, wherein the second common mode choke comprises a second pair of load pins configured to electrically couple to the second power source.

19. The communication system of claim 1, wherein the first power supply channel is a transmission line.

20. The communication system of claim 1 wherein the first common mode choke comprises a first pair of load pins configured to electrically couple to the first power source.

* * * * *